United States Patent
Shinagawa

(10) Patent No.: US 10,916,411 B2
(45) Date of Patent: Feb. 9, 2021

(54) SENSOR-TO-SENSOR MATCHING METHODS FOR CHAMBER MATCHING

(71) Applicant: Tokyo Electron Limited, Tokyo (JP)

(72) Inventor: Jun Shinagawa, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/538,313

(22) Filed: Aug. 12, 2019

(65) Prior Publication Data

US 2020/0051787 A1 Feb. 13, 2020

Related U.S. Application Data

(60) Provisional application No. 62/718,034, filed on Aug. 13, 2018.

(51) Int. Cl.
*H01J 37/32* (2006.01)

(52) U.S. Cl.
CPC .. *H01J 37/32183* (2013.01); *H01J 37/32449* (2013.01); *H01J 37/32972* (2013.01)

(58) Field of Classification Search
CPC ........... H01J 37/32183; H01J 37/32449; H01J 37/32972
USPC ............................................. 216/59, 60, 61
See application file for complete search history.

(56) References Cited

U.S. PATENT DOCUMENTS

| | | | |
|---|---|---|---|
| 7,757,574 B2 | 7/2010 | Renken et al. |
| 7,855,549 B2 | 12/2010 | Renken et al. |
| 7,924,408 B2 | 4/2011 | DiBiase et al. |
| 8,033,190 B2 | 10/2011 | Renken et al. |
| 8,104,342 B2 | 1/2012 | Sun et al. |
| 8,604,361 B2 | 12/2013 | Sun et al. |
| 8,681,493 B2 | 3/2014 | Vishal et al. |
| 8,889,021 B2 | 11/2014 | Jensen et al. |
| 9,134,186 B2 | 9/2015 | Sun et al. |
| 9,140,604 B2 | 9/2015 | Jensen et al. |
| 9,222,842 B2 | 12/2015 | Sun et al. |
| 9,514,970 B2 | 12/2016 | Vishal et al. |
| 9,719,867 B2 | 8/2017 | Sharratt et al. |
| 9,823,121 B2 | 11/2017 | Sun et al. |
| 10,795,346 B2 | 10/2020 | Yennie et al. |

(Continued)

*Primary Examiner* — Binh X Tran
(74) *Attorney, Agent, or Firm* — Oblon, McClelland, Maier & Neustadt, L.L.P.

(57) ABSTRACT

Embodiments are described herein for sensor-to-sensor matching methods for chamber matching across multiple plasma processing chambers. For disclosed embodiments, a baseline signature in a first processing chamber is compared to a signature generated in a second processing chamber in order to adjust and match sensor display values for the second processing chamber. The baseline signature is determined using a golden reference sensor disposed within the first processing chamber and plasma sensors monitoring a baseline plasma. The signature of the plasma is determined using the golden reference sensor disposed within the second processing chamber and plasma sensors monitoring the plasma. Differences are determined between the baseline signature and the signature, and a display value for the plasma sensors for the second processing chamber is adjusted based on the differences to provide chamber matching with the first processing chamber. The golden reference sensor can be a wafer with embedded sensors.

20 Claims, 6 Drawing Sheets

(56) References Cited

U.S. PATENT DOCUMENTS

| | | | |
|---|---|---|---|
| 2006/0180570 A1* | 8/2006 | Mahoney | H01J 37/32935 216/59 |
| 2010/0084544 A1* | 4/2010 | Tallavarjula | G01J 3/443 250/252.1 |
| 2015/0348854 A1* | 12/2015 | Kapoor | H01J 37/32899 438/10 |
| 2017/0098565 A1* | 4/2017 | Lu | G05B 19/4189 |
| 2017/0117869 A1* | 4/2017 | Leeser | H03H 7/38 |
| 2018/0040460 A1* | 2/2018 | Gottscho | H01J 37/32926 |
| 2018/0082826 A1 | 3/2018 | Guha et al. | |
| 2019/0049937 A1* | 2/2019 | Tetiker | G03F 1/36 |

\* cited by examiner

SENSOR-TO-SENSOR MATCHING METHODS FOR CHAMBER MATCHING

RELATED APPLICATIONS

This application claims priority to the following provisional application: U.S. Provisional Patent Application Ser. No. 62/718,034, filed Aug. 13, 2018, and entitled "SENSOR TO SENSOR MATCHING METHODS," which is hereby incorporated by reference in its entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, process flows are being requested to reduce feature size while maintaining structure integrity for various patterning processes.

Plasma processing systems including plasma processing chambers are used in the manufacture of microelectronic workpieces. For example, a plasma processing chamber may be used to generate plasma or ionized gas(es) at sub-atmospheric conditions using one or more electrodes to apply electrical energy to the gas to initiate the deionization process. Plasma may be used to etch patterns in semiconductor substrates to form microelectronic devices across the surface of the substrate. Device performance may be driven by the geometry or profile of the patterns. As such, it is desirable to etch the same pattern in a consistent and predictable way enabling the plasma processing chamber or groups of chambers across the same tool or multiple tools to perform in the same way. In order to provide this consistency, plasma processing chambers are designed to control chamber pressure, gas flow, temperature, applied power such as potential differences from direct current (DC) and/or alternating current (AC) sources applied to electrodes (e.g., transmission sources), and/or other process conditions for the chamber. Maintaining accurate and repeatable control of these process conditions, therefore, is desirable to achieve uniform performance for devices fabricated within substrates processed in the plasma processing chambers or groups of chambers performing the same or similar processes.

Performance matching across multiple chambers, however, can be difficult and time consuming. For example, achieving chamber matching by referencing plasma sensor values among multiple processing chambers is extremely challenging because of measurement errors arising from variabilities in sensor assembly parts and/or other sources. Variabilities can include, for example, window conditions for optical emission spectrometry (OES) sensors, impedances for radio frequency (RF) voltage sensors, impedance mismatches between sensors, and/or other sensor-related variabilities. Measurement errors caused by these variabilities reduce the accuracy of sensor measurements and cause discrepancies among different sensors. As such, improvements to reduce the cost, time, and quality of the sensor and chamber matching is desirable.

For prior solutions, chamber matching is typically implemented by matching direct metrology measurements on patterned test wafers. For example, direct metrology measurements are made for product parameters such as critical dimension (CD) or etch rate (ER) for a plasma process performed within the chambers. While these metrology-based matching techniques can achieve good matching for specific structural dimensions on patterned test wafers, these metrology-based matching techniques typically do not provide matching of plasma related parameters or other non-measured structural dimensions, thereby resulting in mismatching of device performance. For example, variations in processes used to fabricate production wafers may induce unnoticed variations on structures that are not directly measured. These unnoticed variations can lead to degradation in the yield and performance of production runs.

SUMMARY

Embodiments are described herein for sensor-to-sensor matching methods for chamber matching across multiple plasma processing chambers. The disclosed embodiments reduce or minimize mismatching of device performance due to chamber-to-chamber variations by achieving chamber matching where significant plasma parameters are matched by adjusting plasma sensor values based upon a combination of golden sensors and chamber plasma sensors. A variety of features, variations, and embodiments can be implemented based upon the techniques described herein.

For one embodiment, a method is disclosed to match plasma processing chambers. In a first processing chamber, the method includes forming baseline plasma based, at least in part, on one or more baseline process conditions being implemented by the first processing chamber of a plasma processing system; and determining a baseline signature of the baseline plasma using a golden reference sensor disposed within the first processing chamber and one or more baseline plasma sensors monitoring the baseline plasma, where the baseline signature is based, at least in part, on data from the golden reference sensor and the baseline plasma sensors. In a second processing chamber, the method includes forming plasma based, at least in part, on the baseline process conditions used to form the baseline plasma; and determining a signature of the plasma using the golden reference sensor disposed within the second processing chamber and one or more plasma sensors monitoring the plasma, where the signature is based, at least in part, on data from the golden reference sensor and the plasma sensors. The method further includes determining differences between the baseline signature and the signature, based, at least in part, on linear or non-linear equations that are representative of the baseline signature and the signature; and then adjusting a display value of at least one of the plasma sensors for the second processing chamber, where the adjusted display value is based, at least in part, on the differences between the baseline signature and the signature. The adjusting compensates for the differences to provide chamber matching between the second processing chamber and the first processing chamber.

In additional embodiments, the forming of the baseline plasma includes varying at least one baseline process condition over a period of time or varying the process condition between two different magnitudes. In further additional embodiments, the forming of the plasma includes varying at least one baseline process condition over a period of time or varying the process condition between two different magnitudes.

In additional embodiments, the display value is displayed on a user-interface for the plasma processing system. In further additional embodiments, the display value of the plasma sensor is equal to a display value of the baseline plasma sensor.

In additional embodiments, the second chamber is connected to the plasma processing system or another plasma processing system.

In additional embodiments, the plasma sensors include at least one of an optical emission spectroscopy sensor, peak-to-peak voltage sensor, or an ion flux sensor. In further additional embodiments, the golden reference sensor includes at least one of an optical emission spectroscopy sensor, peak-to-peak voltage sensor, or an ion flux sensor. In still further additional embodiments, the process conditions include gas flow, substrate temperature, applied power to an electrode, chamber pressure, or any combination thereof.

In additional embodiments, the signature is based, at least in part, on the at least one process condition varying between two or more values. In further embodiments, the signature is represented by a linear equation that is representative of plasma sensor readings during the varying of the process conditions.

In additional embodiments, the baseline process conditions include one or more of the following: flow rate, temperature, pressure, or power. In further additional embodiments, the process conditions include one or more of the following: flow rate, temperature, pressure, or power.

In additional embodiments, the signature is based, at least in part, on a detectable characteristic of the plasma using the one or more plasma sensors. In further embodiments, the detectable characteristic include peak-to-peak voltage of the plasma, ion density within the plasma, neutral density within the plasma, radical density within the plasma, or density of constituents of the plasma.

In additional embodiments, the signature and the baseline signature are represented by linear or non-linear equations. In further additional embodiments, the gold reference sensor includes one or more sensors formed within a wafer that can be positioned within the first and second processing chambers.

In additional embodiments, the determining differences includes calibrating data from the baseline plasma sensors with data from the golden reference sensor and calibrating data from the plasma sensors with data from the golden reference sensor. In further embodiments, the determining differences further includes comparing the calibrated data from the plasma sensors to the calibrated data from the baseline plasma sensors. In still further embodiments, the adjusting includes adjusting the display value based upon the comparison to match the second processing chamber with the first processing chamber.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
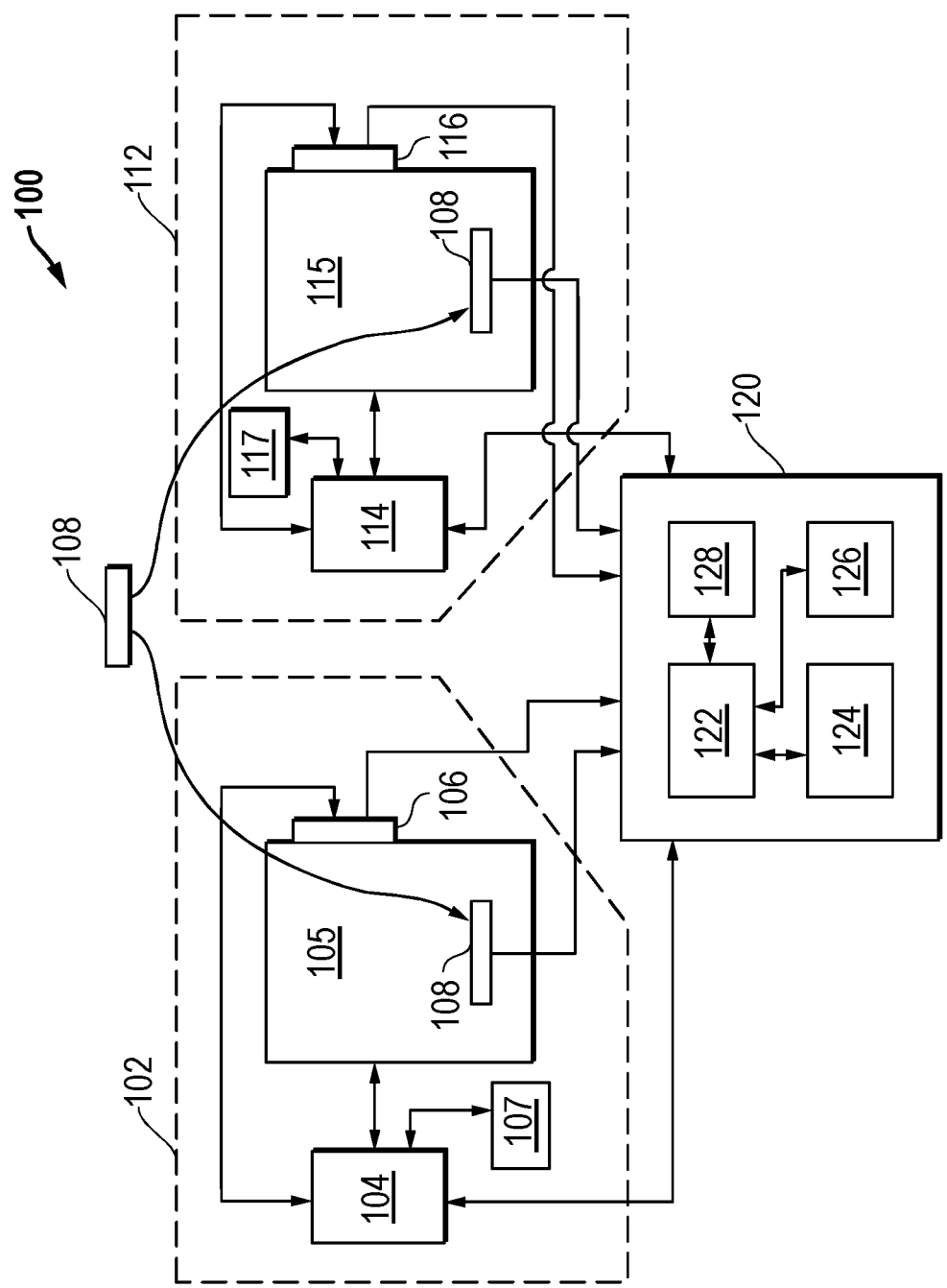
FIG. 1 is a block diagram of an example embodiment where a golden reference sensor and chamber plasma sensors are used to provide sensor-to-sensor matching for chamber matching processing between two plasma processing systems.

Sensor-to-sensor matching methods are disclosed for chamber matching across multiple plasma processing chambers. The disclosed embodiments provide chamber matching of plasma parameters by adjusting plasma sensor values based upon a comparison of measurements from golden sensors and plasma sensors between a second process chamber and a first baseline process chamber. A variety of advantages and implementations can be achieved while taking advantage of the process techniques described herein.

The novel methods disclosed herein account for the sensor-to-sensor and chamber-to-chamber variations that cause problems in prior chamber matching solutions using one or more golden sensors shared between chambers and adjusting sensor display values to compensate for variations in processing chambers within the same plasma processing system or across multiple plasma processing systems. These adjustments help to ensure different chambers across the same or similar processing equipment will control plasma processes in the same or similar way. As such, these adjustments help to decrease or minimize device performance differences for devices manufactured in different processing chambers.

As described herein, the disclosed embodiments in part use in-chamber sensors as golden reference sensors to match plasma parameters as these in-chamber sensors are independent of chamber-specific plasma sensors. The golden reference sensors described herein allow plasma sensors to be calibrated across different chambers to achieve repeatable process performance by improving chamber-level standardization or cross-verification of the plasma processing systems. The golden reference sensors may include electrical, magnetic, optical, and/or mechanical sensors used to monitor plasma or environmental conditions within the processing chamber. The golden reference sensors may include one or more of these sensors embedded in a wafer-like substrate that can be placed inside a process chamber during plasma processing to monitor characteristics of the plasma or other aspects of the chamber. These wafer sensors are relatively non-intrusive to the plasma conditions being monitored and provide similar configurations to actual manufacturing conditions. Although the wafer sensor provides a preferable solution for the golden reference sensors, other types of sensors could also be used that can be positioned within a process chamber and moved between process chambers. For one embodiment, the golden reference sensors are in electrical communication with a microprocessor system to record and analyze the conditions detected by the sensors.

It is noted that the golden reference sensors may be able to monitor plasma without limitations that are applicable to the in-situ sensors for the process chamber. For example, an in-situ chamber-specific plasma sensor, such an OES sensor, may be placed behind a window to isolate the sensor from chamber conditions. In some instances, the window transmittance may vary due to inherent properties or physical changes caused by exposure of the window material to plasma processing. Additionally, variations in the in-situ plasma sensors may be induced by variations in the components parts used to build the sensors. The golden reference sensors are used to account for or minimize these sources of variation between the plasma sensors. As such, the golden reference sensors can be used to calibrate or match chamber plasma sensors across different chambers for different plasma processing systems as described herein.

It is noted that the chamber plasma sensors can be a wide variety of sensors configured to measure plasma or chamber conditions. For example, one plasma sensor can be an OES sensor. OES sensors are typically installed behind a window to protect the OES sensor from conditions within the processing chamber. These intervening windows, however, can cause variabilities due to window crowding, installation differences, and/or other variabilities. The plasma sensor can also be a bias voltage peak-to-peak (VPP) sensor. VPP sensors, however, can have variabilities due to impedance mismatch from part tolerances, installation differences, and/ or other variabilities. The plasma sensor can also be an ion flux sensor, and this ion flux sensor can have similar variabilities to the VPP sensor. Other plasma sensors could also be used for the processing chambers and will likely have variabilities as well.

FIG. 1 is a block diagram of an example embodiment 100 where a golden reference sensor and chamber-specific plasma sensors are used to provide sensor-to-sensor matching for chamber matching. A first plasma processing system 102 includes a processing chamber 105, a control unit 104, and one or more plasma sensors 106. The plasma sensors 106 are specific to the first plasma processing chamber 105 and are used as baseline plasma sensors for the chamber matching described herein. Display values associated with the sensor data collected by the plasma sensors 106 are displayed to a user through display 107. A second plasma processing system 112 includes a processing chamber 115, a control unit 114, and one or more plasma sensors 116. The plasma sensors 116 are specific to the second plasma processing chamber 105 and are being calibrated or adjusted to provide the chamber matching described herein. Display values associated with the sensor data collected by the plasma sensors 116 are displayed to a user through display 117. For the chamber matching method, at least one golden reference sensor 108 is positioned within the process chamber 105 for the first plasma processing system 102 to monitor the plasma during processing within the processing chamber 105. The same golden reference sensor 108 is also positioned within the process chamber 115 for the second plasma processing system 112 to monitor the plasma during processing within the processing chamber 115. Measurements made by the plasma sensors 106, the plasma sensors 116, and the golden reference sensor 108 are communicated to a computing platform 120.

It is noted that the second processing chamber 115 can be an additional processing chamber that is part of the first plasma processing system 102 rather than being part of the second plasma processing system 112. For this example embodiment, the second chamber 115 is controlled by the control unit 104. The sensor data collected for this second chamber 115 using sensors 116 can be displayed through a user interface 107 or through an additional user interface 117 if provided for the second processing chamber 115. Other variations can also be implemented.

The computing platform 120 is configured to implement the sensor-to-sensor and chamber matching functions described herein. These matching techniques include the generation of a baseline signature from the plasma processing within the first processing chamber 105 and another signature from the plasma processing within the second processing chamber 115. The baseline signature is generated based upon the plasma sensors 106 and the golden reference sensor 108 for the plasma processing within the first processing chamber 105. Another signature is generated based upon the plasma sensors 116 and the golden reference sensor 108 for the plasma processing within the second processing chamber 115. Differences between this signature and the baseline signature are used to adjust the sensor display values for the plasma sensors 116 and thereby provide chamber-to-chamber matching. These adjusted display values calibrate or match the plasma processing performed by the second plasma processing system 112 with the plasma processing performed by the first plasma processing system 102.

A computing platform 120 communicates with the control unit 104 for the first plasma processing system 102 and the control unit 114 for the second plasma processing system 112 through wired and/or wireless communications and one or more intervening communication nodes can also be used. The computing platform 120 communicates with the golden reference sensor 108 to receive data associated with its measurements, although intervening interfaces and devices could also be used for this transfer of measured data. The computing platform 120 can also communicate with the sensors 106/116 for the plasma processing systems 102/112 or can receive data associated with measurements made by these sensors 106/116 through the control units 104/114. The computing platform 120 operates to implement the chamber matching functions described herein using one or more programmed algorithms.

For the example embodiment 100, the computing platform 120 includes one or more processors 122 or other programmable integrated circuit(s) that are programmed with software or logic instructions to perform the operations and functions described herein. The controller 122 also includes a memory 124, a data storage medium 126, and a user interface 128. Although not shown, the computing platform 120 can also include other components such as one or more input/output (I/O) ports, one or more wired and/or wireless communication interfaces, and/or other components. The user interface 128 can include a display, a keyboard, a mouse, and/or other input/output devices that are used by a user to interface with the computing platform 120. The memory 124 can include one or more memory devices that store instructions and/or data during operation of the computing platform 120. For one example during operation, the processor 122 or other programmable integrated circuits can load software or program instructions stored in the data storage medium 126 into the memory 124 and then execute the software or program instructions to perform the operations and functions described herein. It is noted that the memory 124 and the data storage medium 126 can be implemented using any desired non-transitory tangible computer-readable medium, such as for example, one or more data storage devices, flash memories, random access memories, read only memories, programmable memory devices, reprogrammable storage devices, hard drives, floppy disks, DVDs, CD-ROMs, and/or any other non-transitory tangible computer-readable data storage mediums. It is further noted that the programmable integrated circuits, such as processor 122, can include one or more processors (e.g., central processing units (CPUs), controllers, microcontrollers, microprocessors, hardware accelerators, ASICs (application specific integrated circuit), and/or other integrated processing devices) and/or one or more programmable logic devices (e.g., CPLDs (complex programmable logic devices), FPGAs (field programmable gate arrays), PLAs (programmable logic array), reconfigurable logic circuits, and/or other integrated logic devices). Other variations and processing systems can also be implemented while still taking advantage of the hash-based selection of network packets for packet flow sampling in network communication systems.

Figure 2A:
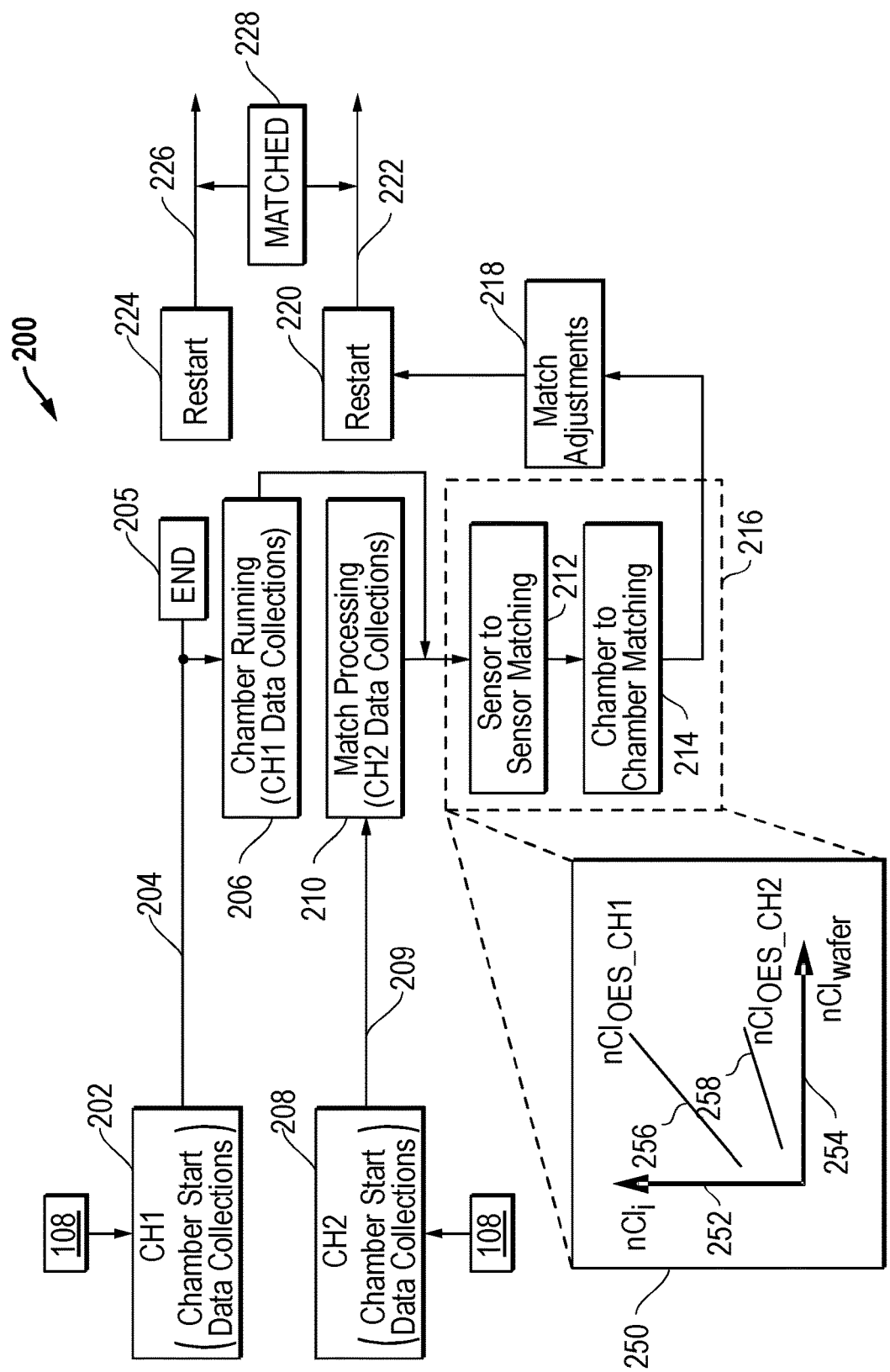
FIG. 2A is a flow diagram of an example embodiment for sensor-to-sensor and chamber-to-chamber matching based upon comparisons of sensor data collected from the plasma sensors associated with two processing chambers and the golden reference sensor positioned within each of the two processing chambers as shown in FIG. 1.

FIG. 2A is a flow diagram of an example embodiment 200 for sensor-to-sensor and chamber-to-chamber matching based upon comparisons of sensor data collected from the plasma sensors 106/116 associated with two processing chambers 105/115 and the golden reference sensor 108 positioned within each of the two processing chambers 105/115 as shown in FIG. 1. Initially, the golden reference sensor 108 is positioned within the first processing chamber (CH1) 105 and a plasma process is started in block 202. Data collection also begins in block 202 using the golden reference sensor 108 and the plasma sensors 106 for the first processing chamber 105. The plasma process continues to run as indicated by arrow 204. As indicated in block 206, the data collected from the first chamber 105 during the process run are used for the matching algorithms 216. These matching algorithms 216 are used to adjust or calibrate the processing performed by the second process chamber (CH2) 115. When enough data has been collected or after the match process has been completed, the process run for the first processing chamber 105 can be ended as represented by block 205. At some later point, processing within the first processing chamber 105 can then be restarted in block 224, for example, with production wafers.

When it is desired to adjust or calibrate the second processing chamber 115 to match the first processing chamber 105, the golden reference sensor 108 is positioned within the second processing chamber (CH2) 115. The same plasma process run in the first processing chamber 105 is started in the second processing chamber 115 in block 208. Data collection also begins in block 208 using the golden reference sensor 108 and the plasma sensors 116 for the second processing chamber 115. The plasma process continues to run as indicated by arrow 209. After run data is collected, match processing is initiated in block 210. The data collected from the first processing chamber 105 in block 206, and the data collected from the second processing chamber 115 in block 210 are applied to the matching algorithms 216. The matching algorithms 216 include sensor-to-sensor matching algorithms 212 and chamber-to-chamber matching algorithms 214. As described below, these algorithms 212/214 can include one or more linear and/or non-linear functions that are applied to the sensor data collected by the plasma sensors 106/116 and the golden reference sensor 108. As described herein, the matching algorithms 216 are used to adjust or calibrate the processing performed by the second process chamber (CH2) 115. In block 218, these matching adjustments are made to sensor display values for the second processing chamber 115. In block 220, processing within the second processing chamber 115 is restarted, for example, with production wafers. Due to the adjustments made in the matching process, the processing 222 for the second processing chamber 105 is now matched to the processing 226 for the first processing chamber 115.

It is noted that this match process can be conducted at any point when it is determined that the second process chamber 115 is or may be operating with undesirable variabilities with respect to the processing performed in the first processing chamber 105. For example, after preventative maintenance (PM) is performed on the processing chamber 115, the matching process can be performed. Other variations and timing could also be applied while still taking advantage of the sensor-to-sensor and chamber-to-chamber techniques described herein.

Looking further to FIG. 2A, block 250 represents an example embodiment for the processing provided by the matching algorithms 216. For this example embodiment, it is assumed that OES sensors are being used such that the plasma sensors 106/116 for the processing chambers 105/115 include OES sensors and the golden reference sensor 108 includes an OES sensor. For one embodiment, a wafer with an embedded OES sensor and/or other sensors is positioned within the plasma processing chambers 105/115 to provide the golden reference sensor 108. The vertical axis 252 represents the magnitude of the emission data collected by these sensors over the process run. For this embodiment, it is assumed that chlorine (Cl) emission data ($nCl_i$) is being collected. The line 256 represents a line fit to emission data ($nCL_{OES\_CH1}$) collected by the plasma sensor 106 for the first processing chamber 105. The line 258 represents a line fit to emission data ($nCL_{OES\_CH2}$) collected by the plasma sensor 116 for the second processing chamber 115. The horizontal axis 254 represents a normalized line fit to data ($nCl_{wafer}$) collected by a wafer used as the golden reference sensor 108. This gold reference data serves as a calibration point for the data collected by the plasma sensors 106/116. It is noted that OES sensors can be configured to detect actinometry values. The actinometry values provide estimates for radical density by taking a ratio of intensities of nearby wavelengths, which make these estimates robust against light transmittance drift due to window crowding. Once the sensor data is collected by the plasma sensors 106/116 and the golden reference sensor 108, this data is used to perform the match processing initiated in block 210 using the matching algorithms 216. First, sensor-to-sensor matching algorithms 212 are applied to calibrate the data values collected from the plasma sensors 106/116 against the data collected by the golden reference sensor 108. As one example embodiment, the data collected by the golden reference sensor 108 is normalized to a horizontal line to provide a calibration reference. Lines are then fitted to data collected by the plasma sensors 106/116 and the following equations are used to calibrate these data lines to the data line for the golden reference sensor 108.

$$nCl_{OES\_CH1} = a_{CH1} nCl_{wafer} + b_{CH1}$$

$$nCl_{OES\_CH2} = a_{CH2}nCl_{wafer} + b_{CH2}$$

For these equations, "$a_{CH1}$" and "$a_{CH2}$" represent slopes and "$b_{CH1}$" and "$b_{CH2}$" represents y-axis intercepts for the example data lines 256/258 depicted in block 250. Next, chamber-to-chamber matching algorithms 214 are applied to match the data from the second processing chamber 115 to the data from the first processing chamber 115. As one example embodiment, the calibrated data line 258 for second processing chamber 115 is matched to the calibrated data line 256 for the first processing chamber 115, and the following equations are used.

$$nCl_{OES\_CH2} = a_{CH2}nCl_{wafer} + b_{CH2} = a_{CH2}\left(\frac{nCl_{OES_{CH1}} - b_{CH1}}{a_{CH1}}\right) + b_{CH2}$$

$$= \frac{a_{CH2}}{a_{CH1}}(nCl_{CH1} - b_{CH1}) + b_{CH2}$$

For this equation, the data for the second processing chamber 115 is now matched to the data from the first processing chamber 105, and data from both of the chambers 105/115 are calibrated to the data for the golden reference sensor 108.

It is again noted that OES data is just one example for a process parameter that can be detected and used for the match process described herein. Other process parameters can also be used. For one further example embodiment, voltage peak-to-peak (VPP) is the process parameter that is detected and used for the matching process. For this embodiment, VPP sensors are included within the plasma sensors 106/116 and the golden reference sensor 108. As indicated above, the golden reference sensor 108 can be a wafer with an embedded VPP sensor as well as other sensors. Where VPP sensors are used for the match process in FIG. 2A, the vertical axis 252 in block 250 represents the magnitude of the VPP data ($VPP_i$) collected by the VPP sensors over the process run. The line 256 represents a line fit to VPP data ($VPP_{OES\_CH1}$) collected by the plasma sensor 106 for the first processing chamber 105. The line 258 represents a line fit to VPP data ($VPP_{OES\_CH2}$) collected by the plasma sensor 116 for the second processing chamber 115. The horizontal axis 254 represents a normalized line fit to data ($VPP_{wafer}$) collected by a wafer used as the golden reference sensor 108. This gold reference data serves as a calibration point for the data collected by the plasma sensors 106/116. Similar to the description and equations above, the matching algorithms 216 are used to match the second processing chamber 115 to the first processing chamber 105.

Regardless of the particular sensors or process parameter being detected, the golden reference method described herein involves placing the golden reference sensors 108 in the process chamber 105/115 and exposing them to baseline process conditions that replicate or approximate qualified manufacturing conditions for a production process. In general, the baseline process conditions may include, but are not limited to, chamber pressure, gas flow rate, applied voltage magnitude and/or frequency or any other process conditions used to generate plasma within the chamber. This baselining process is implemented across the chambers to assess the process variation between chambers. For example, a known or qualified chamber may be compared against an unqualified chamber that is being installed or is recovering from maintenance activity and is pending qualification or calibration before it is released to production.

In some instances, the baseline conditions will involve a series of different process conditions that may vary one process condition at a time over a magnitude range to determine chamber performance within a process window, such that the chamber may be qualified or calibrated to operate several different processes in the same or similar manner as other chambers that run the same processes. In some instances, the baselining process may be used for several variables, in that one process condition may be varied at one time and data from all of the baseline test may be used to form one or more signatures that may be compared against other chambers. For example, a baseline process signature from a known or verified chamber may be compared against an unqualified or uncalibrated chamber to determine how to adjust the sensor reading to read the same or similar as the baseline chamber, while accurately detecting the same or similar process condition in both chambers.

The signatures may be linear (as shown in FIG. 2A) or non-linear mathematical representations of the sensor data and process conditions that were collected by the golden reference sensor 108 and the in-situ plasma sensors 106/116. The computing platform 120 may be used to determine difference between the signatures and assign an offset value that shifts or adjusts unqualified signatures to overlay or adjust them to match the baseline signature, such that plasma conditions are matched within both chambers. For one embodiment, the signatures are based, at least in part, on a detectable characteristic of the plasma using the one or more plasma sensors. The detectable characteristic can include, for example, peak-to-peak voltage of the plasma, ion density within the plasma, neutral density within the plasma, radical density within the plasma, density of constituents of the plasma, and/or other characteristics.

Figure 2B:
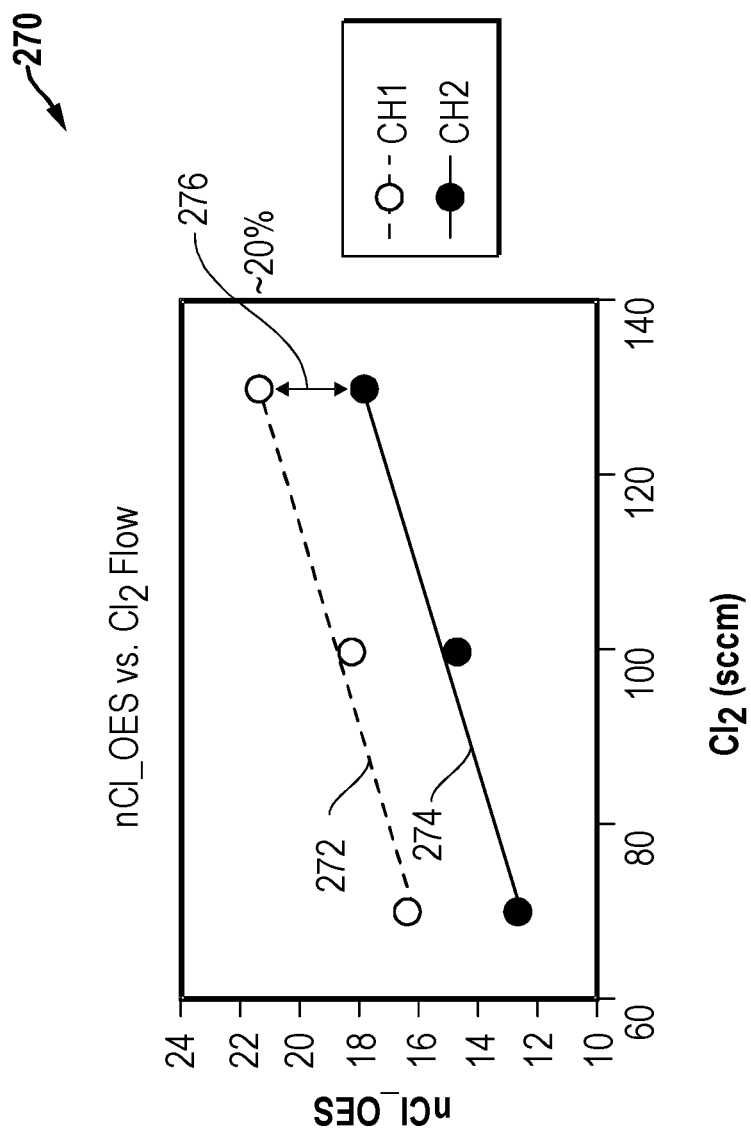
FIG. 2B provides an example embodiment for matching data collected for two plasma processing chambers using optical emission spectrometry (OES) sensors.

FIG. 2B provides an example embodiment for matching data from two plasma processing chambers 105/115 as shown in FIG. 1 and FIG. 2A. The first processing chamber 105 is the baseline chamber, and the second processing chamber 115 is the non-baseline or unqualified chamber in which baseline conditions are used for calibration. The condition being tested is atomic chlorine (Cl) density using OES sensors. The vertical axis represents the level of emissions (nCl_OES) detected, and the horizontal axis represents the density of chlorine ($Cl_2$) in standard-cubic-centimeters-per-minute (sccm). As shown, there is a difference 276 of 20% between the two OES sensor signatures where signature 272 represents data from the first processing chamber 105 and signature 274 represents data from the second processing chamber 115. As represented for this embodiment, a plus-4 (+4) offset is needed to account for the sensor mismatch between the chambers. In one embodiment, the control unit 114 for the second processing chamber 115 will adjust the display value of the OES sensor 116 to account for this difference. As such, the displayed OES values will be the same or similar to those for the first processing chamber 105. As described above, the data for this first processing chamber 105 can be calibrated against the data for the golden reference sensor 108 prior to be used to adjust the display values for the second processing chamber 115.

In other embodiments, the chamber plasma signatures may be represented by non-linear equations for a baseline chamber and an uncalibrated chamber. The computing platform 120 may then analyze the two signatures and determine an appropriate adjustment to the displayed sensor values on a user interface, such that the display values between the two chambers are the same or similar.

As described above, a golden reference sensor 108 may be used to match optical emission spectroscopy (OES) sensors attached to the processing chambers based, at least in part, on actinometry values. Actinometry estimates are also collected through OES sensors embedded in the golden reference sensor. The OES sensors are used to monitor light wavelength and/or intensity emitted from plasma generated in the process chamber. In normal operations, OES sensors may be used to monitor plasma composition run-to-run and detect slight changes in plasma chemistry or environmental conditions within the chamber.

As also described above, voltage peak-to-peak (VPP) sensors may be embedded into a wafer-like substrate that is be placed in a chamber during plasma processing to provide the golden reference sensors 108. VPP is the amount of RF voltage present at the surface of the substrate from RF power applied to the electrodes either above or below the substrate within the processing chamber. The VPP data detected for the first processing chamber 105 is used as the baseline signature that is compared against VPP data collected for the second processing chamber 115. For example, the baseline process conditions may vary the pressure and the applied power to generate the respective plasma signatures for each chamber. If the plasma signatures are sufficiently matched, then no match adjustments are required to the VPP display values. However, where there are significant differences beyond an acceptable amount, the computing platform 120 is used to shift the slope and/or y-intercept of the signature for the second processing chamber 115, as described above, such that the display values for VPP data for the second processing chamber 115 will match the display values for the VPP data for the first processing chamber 105.

For one further embodiment, an ion flux sensor is included in the golden reference sensor 108 and the plasma sensors 106/116. This ion flux sensor is used to detect differences between in-situ ion flux sensors included within the plasma sensors 106/116 for the first and second processing chambers 105/115. Similarly, the matching algorithms 216 run by the computer platform 120 conduct a similar signature analysis as described above for the OES sensors and the VPP sensors. Two ion-flux signatures are generated and adjusted so that the ion-flux values displayed on the user interface for the second processing chamber 115 are the same or similar to the ion-flux values displayed on the user interface for the first processing chamber 105. In this way, chamber-to-chamber matching is provided based upon the sensor data.

Figure 3:
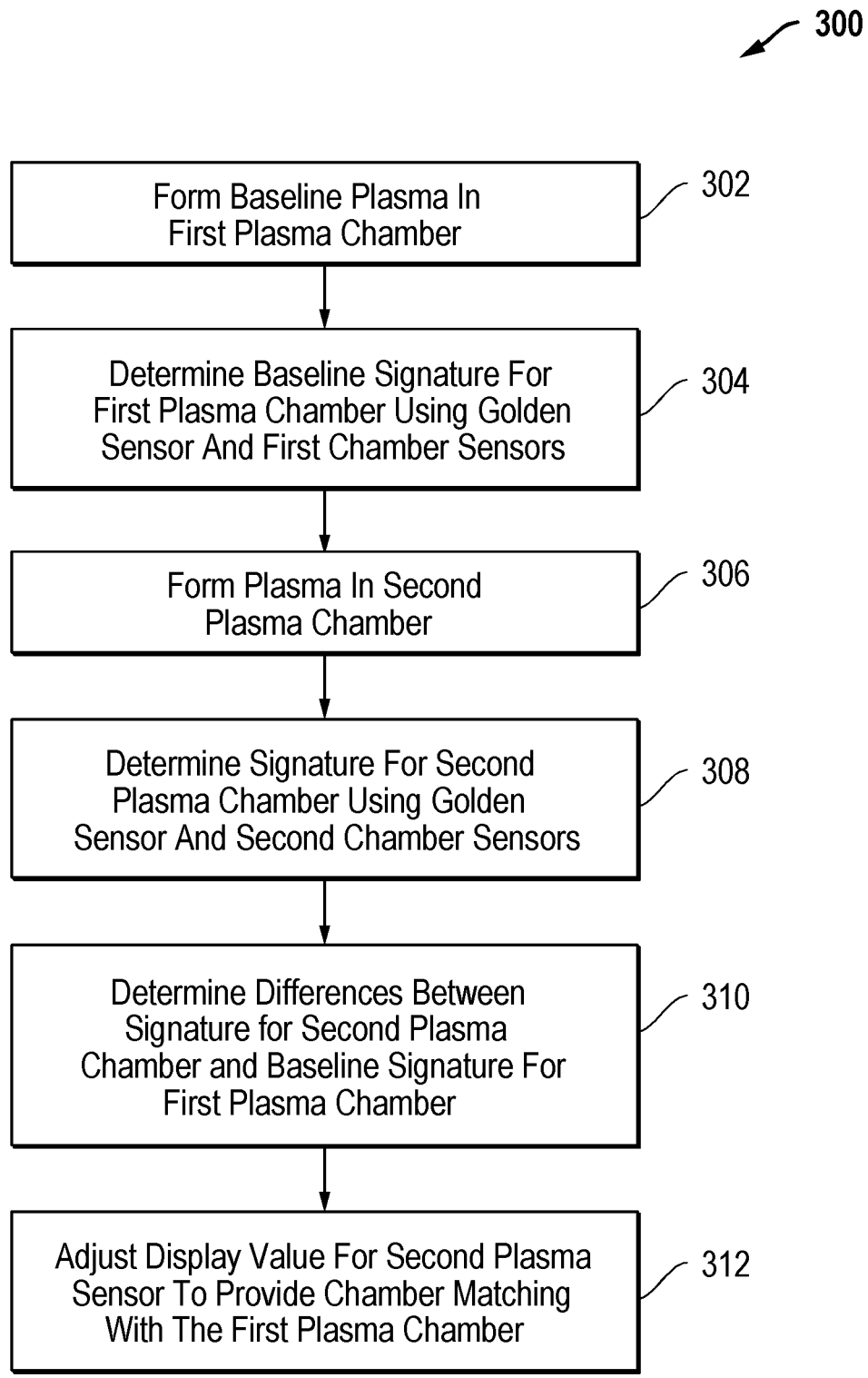
FIG. 3 is a flow diagram of an example embodiment for the generation of a baseline signature in a first processing chamber that is compared to a signature generated in a second processing chamber in order to adjust and match sensor display values for the second processing chamber to the first processing chamber.

FIG. 3 is a flow diagram of an example embodiment 300 for the generation of a baseline signature in a first processing chamber that is compared to a signature generated in a second processing chamber in order to adjust and match sensor display values for the second processing chamber. In block 302, a baseline plasma is formed in a first processing chamber based, at least in part, on one or more baseline process conditions being implemented by the first processing chamber of a plasma processing system. For one embodiment, the forming of the baseline plasma includes varying at least one baseline process condition over a period of time or varying the process condition between two different magnitudes. In block 304, a baseline signature of the baseline plasma is determined using a golden reference sensor disposed within the first processing chamber and one or more baseline plasma sensors monitoring the baseline plasma, the baseline signature being based, at least in part, on data from the golden reference sensor, the baseline plasma sensors, and/or the baseline process conditions. In block 306, plasma is formed in a second processing chamber based, at least in part, on the baseline process conditions used to form the baseline plasma. For one embodiment, the forming of the plasma includes varying at least one baseline process condition over a period of time or varying the process condition between two different magnitudes. In block 308, a signature of the plasma is determined using the golden reference sensor disposed within the second processing chamber and one or more plasma sensors monitoring the plasma, the signature being based, at least in part, on data from the golden reference sensor, the plasma sensors, and/or the baseline process conditions. In block 310, differences are determined between the baseline signature and the signature, based, at least in part, on linear or non-linear equations that are representative of the baseline signature and the signature. In block 312, a display value of at least one of the plasma sensors for the second processing chamber is adjusted where the adjusted display value is based, at least in part, on the differences between the baseline signature and the signature, and where the adjusting compensates for the differences to provide chamber matching with the first processing chamber.

Figure 4:
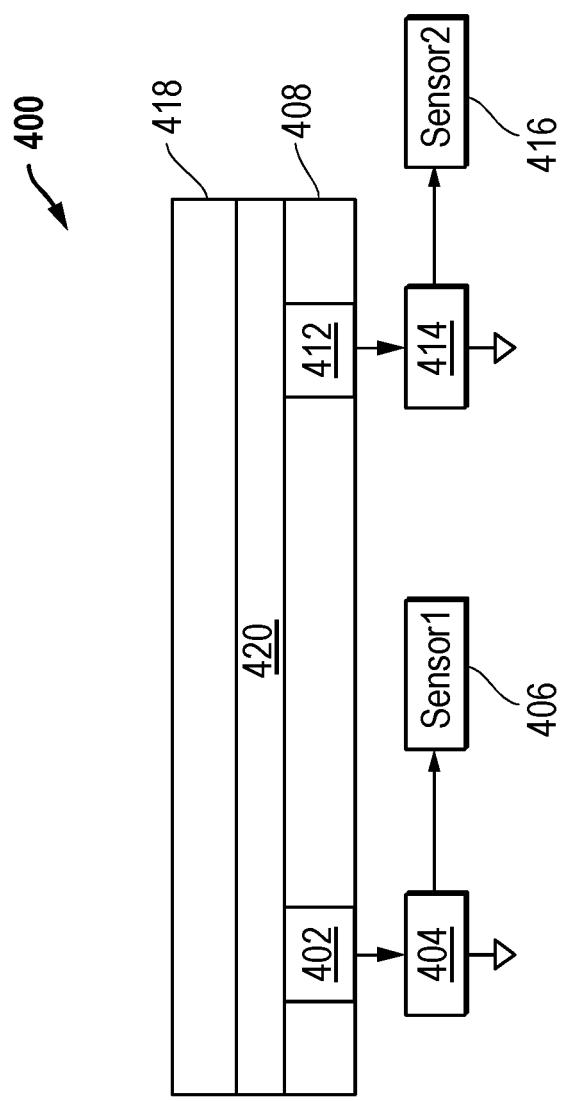
FIG. 4 is a cross-section diagram of an example embodiment for a wafer that has one or more embedded sensors and is used as the golden reference sensor shown in FIG. 1.

FIG. 4 is a cross-section diagram of an example embodiment 400 for a wafer that has one or more embedded sensors and is used as the golden reference sensor 108 shown in FIG. 1. A substrate 408, such as a semiconductor substrate, includes circuits and connections that provide one or more plasma sensors. For example, the plasma sensors can include OES sensors, VPP sensors, ion-flux sensors, and/or other desired sensors. For the example embodiment 400, two plasma sensors 402 and 412 are embedded within a substrate 408. Output circuits 404 and 414 for the sensors 402 and 412 receive sensor-related information from the sensors 402 and 412. The output circuits 404 and 414 generate sensor data 406 and 416, respectively. The wafer including substrate 408 with the embedded sensors 402/412 can be used as the golden reference sensor 108, which is positioned within each of the processing chambers 105/115 as described with respect to FIG. 1 and FIG. 2A above. During operation, a plasma 452 is formed above the wafer, and a sheath 454 is formed between the plasma 452 and the top of the wafer. The sensors 102/112 can then be used to detect one or more parameters associated with the plasma processing within the processing chambers 105/115. The sensor data (sensor 1) 406 and the sensor data (sensor 2) 416 as well as sensor data from other sensors included within the wafer can be used as data from a golden reference sensor 108 for the matching processing described herein.

Figure 5:
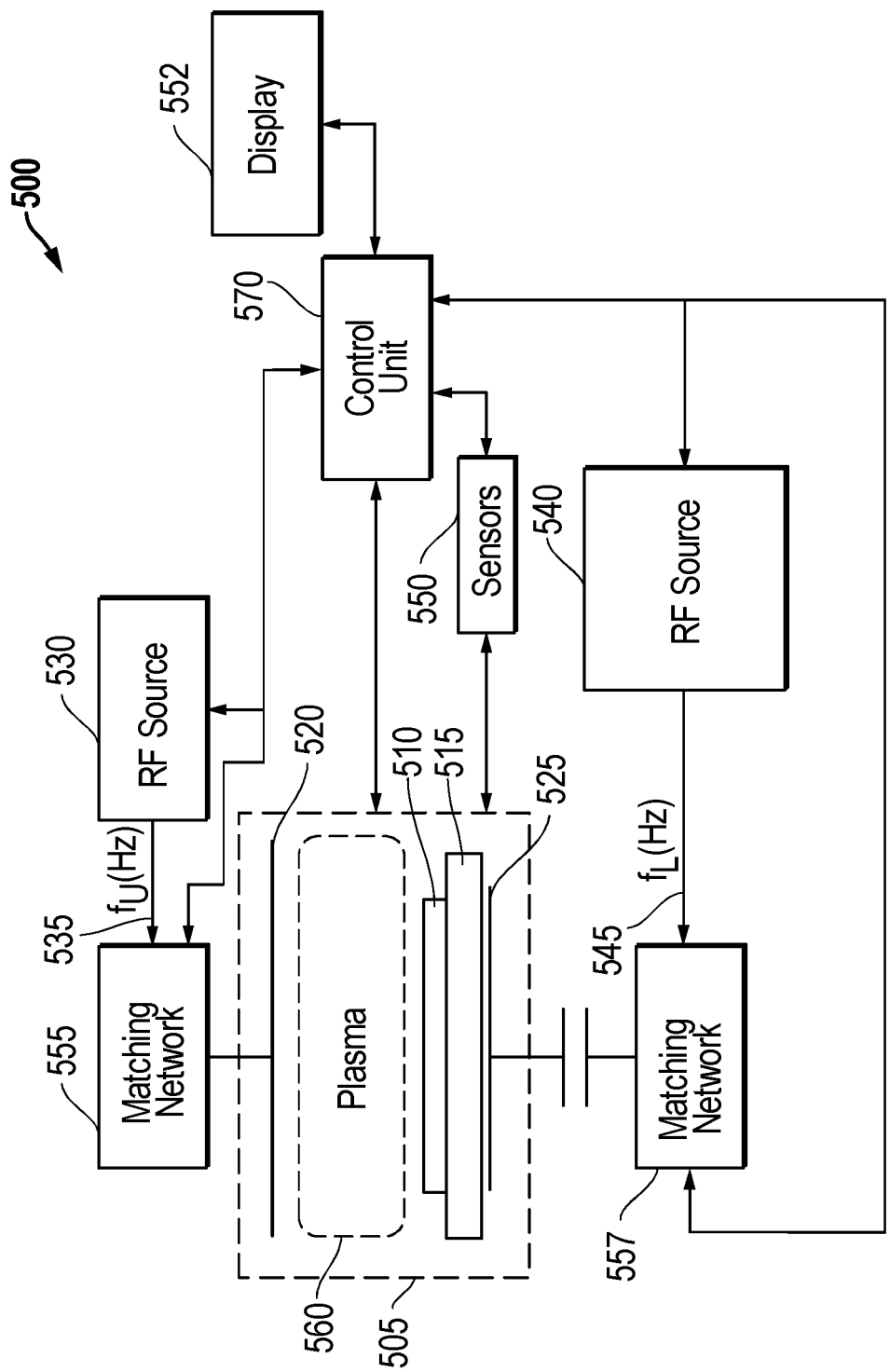
FIG. 5 provides one example embodiment for a plasma processing system that can be used with respect to the disclosed techniques and is provided only for illustrative purposes.

FIG. 5 provides one example embodiment for a plasma processing system 500 that can be used with respect to the disclosed techniques and is provided only for illustrative purposes. The plasma processing system 500 may be a capacitively coupled plasma processing apparatus, inductively coupled plasma processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 500 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 500 is well known, and the particular structure provided herein is merely of illustrative purposes. It will be recognized that different and/or additional plasma process systems may be implemented while still taking advantage of the techniques described herein.

The plasma processing system 500 includes one or more plasma sensors 550 that measure the operational data described herein, such as OES data, VPP data, ion-flux data, and/or other data associated with operation of the plasma processing system 500. The one or more sensors 550 can include an OES sensor, a VPP sensor, and ion-flux sensor, and/or other sensors. As describe above, the control unit 570 for the plasma processing system 500 can be configured to adjust or calibrate values displayed to a user through a display 352 or other user interface. As such, the display values depicted for the sensors 550 with respect to the processing chamber 305 can be adjusted and calibrated to match the display values for a processing chamber within another plasma processing system, such as a previously qualified plasma processing chamber. Other variations can also be implemented.

Looking in more detail to FIG. 5, the plasma processing system 500 may include a process chamber 505. As is known in the art, process chamber 505 may be a pressure-controlled chamber. A substrate 510 (in one example a semiconductor wafer) may be held on a stage or chuck 515. An upper electrode 520 and a lower electrode 525 may be provided as shown. The upper electrode 520 may be electrically coupled to an upper radio frequency (RF) source 530 through an upper matching network 555. The upper RF source 530 may provide an upper frequency voltage 535 at an upper frequency (fu). The lower electrode 525 may be electrically coupled to a lower RF source 540 through a lower matching network 557. The lower RF source 540 may provide a lower frequency voltage 545 at a lower frequency (fL). Though not shown, it will be known by those skilled in the art that a voltage may also be applied to the chuck 515.

The components of the plasma processing system 500 can be connected to, and controlled by, the control unit 570 that in turn can be connected to a corresponding memory storage unit and user interface (all not shown). Various plasma-processing operations can be executed via the user interface, and various plasma processing recipes and operations can be stored in a storage unit. Accordingly, a given substrate can be processed within the plasma-processing chamber with various microfabrication techniques. It will be recognized that since control unit 570 may be coupled to various components of the plasma processing system 500 to receive inputs from and provide outputs to the components.

The control unit 570 can be implemented in a wide variety of manners. For example, the control unit 570 may be a computer. In another example, the control unit includes one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 560 in the process chamber 505 when applying power to the system from the upper RF source 530 and the lower RF source 540. Further, as is known in the art, ions generated in the plasma 560 may be attracted to the substrate 510. The generated plasma can be used for processing a target substrate (such as substrate 510 or any material to be processed) in various types of treatments such as, but not limited to, plasma etching, chemical vapor deposition, treatment of semiconductor material, glass material and large panels such as thin-film solar cells, other photovoltaic cells, organic/inorganic plates for flat panel displays, and/or other applications, devices, or systems.

Application of power results in a high-frequency electric field being generated between the upper electrode 520 and the lower electrode 525. Processing gas delivered to process chamber 505 can then be dissociated and converted into a plasma. As shown in FIG. 5, the exemplary system described utilizes both upper and lower RF sources. For example, high-frequency electric power, for an exemplary capacitively coupled plasma system, in a range from about 5 MHz to 150 MHz or above may be applied from the upper RF source 530 and a low frequency electric power in a range from about 0.2 MHz to 40 MHz can be applied from the lower RF source. Different operational ranges can also be used. Further, it will be recognized that the techniques described herein may be utilized with in a variety of other plasma systems. In one example system, the sources may be switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate; a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method, comprising:
    forming baseline plasma in a first processing chamber based, at least in part, on one or more baseline process conditions being implemented by the first processing chamber of a plasma processing system;
    determining a baseline signature of the baseline plasma using a golden reference sensor disposed within the first processing chamber and one or more baseline plasma sensors monitoring the baseline plasma, the baseline signature being based, at least in part, on data from the golden reference sensor and the baseline plasma sensors;
    forming plasma in a second processing chamber based, at least in part, on the baseline process conditions used to form the baseline plasma;
    determining a signature of the plasma using the golden reference sensor disposed within the second processing chamber and one or more plasma sensors monitoring the plasma, the signature being based, at least in part, on data from the golden reference sensor and the plasma sensors;
    determining differences between the baseline signature and the signature, based, at least in part, on linear or non-linear equations that are representative of the baseline signature and the signature; and
    adjusting a display value of at least one of the plasma sensors for the second processing chamber, the adjusted display value being based, at least in part, on the differences between the baseline signature and the signature, and the adjusting compensating for the differences to provide chamber matching between the second processing chamber and the first processing chamber.

2. The method of claim 1, wherein the forming of the baseline plasma comprises varying at least one baseline process condition over a period of time or varying the at least one baseline process condition between two different magnitudes.

3. The method of claim 1, wherein the forming of the plasma comprises varying at least one baseline process condition over a period of time or varying the at least one baseline process condition between two different magnitudes.

4. The method of claim 1, wherein the display value is displayed on a user-interface for the plasma processing system.

5. The method of claim 1, wherein the display value of the plasma sensor is equal to a display value of the baseline plasma sensor.

6. The method of claim 1, wherein the second chamber is connected to the plasma processing system or another plasma processing system.

7. The method of claim 1, wherein the plasma sensors comprise at least one of an optical emission spectroscopy sensor, peak-to-peak voltage sensor, or an ion flux sensor.

8. The method of claim 1, wherein the golden reference sensor comprises at least one of an optical emission spectroscopy sensor, peak-to-peak voltage sensor, or an ion flux sensor.

9. The method of claim 1, wherein the baseline process conditions comprise gas flow, substrate temperature, applied power to an electrode, chamber pressure, or any combination thereof.

10. The method of claim 1, wherein the signature is based, at least in part, on the at least one baseline process condition varying between two or more values.

11. The method of claim 10, wherein the signature is represented by a linear equation that is representative of plasma sensor readings during the varying of the baseline process conditions.

12. The method of claim 1, wherein the baseline process conditions comprise one or more of the following: flow rate, temperature, pressure, or power.

13. The method of claim 1, wherein the baseline process conditions comprise one or more of the following: flow rate, temperature, pressure, or power.

14. The method of claim 1, wherein the signature is based, at least in part, on a detectable characteristic of the plasma using the one or more plasma sensors.

15. The method of claim 14, wherein the detectable characteristic comprises peak-to-peak voltage of the plasma, ion density within the plasma, neutral density within the plasma, radical density within the plasma, or density of constituents of the plasma.

16. The method of claim 1, wherein the signature is represented by a linear equation representative of plasma sensor readings during varying of the baseline process conditions.

17. The method of claim 1, wherein the gold reference sensor comprises one or more sensors formed within a wafer configured to be positioned within the first and second processing chambers.

18. The method of claim 1, wherein the determining differences comprises calibrating data from the baseline plasma sensors with data from the golden reference sensor and calibrating data from the plasma sensors with data from the golden reference sensor.

19. The method of claim 18, wherein the determining differences further comprises comparing the calibrated data from the plasma sensors to the calibrated data from the baseline plasma sensors.

20. The method of claim 19, wherein the adjusting comprising adjusting the display value based upon the comparison to match the second processing chamber with the first processing chamber.

* * * * *